United States Patent [19]

Slavin

[11] Patent Number: 4,764,721

[45] Date of Patent: Aug. 16, 1988

[54] LOCKING SCALES TO WAVEFORM DISPLAYS

[75] Inventor: Keith R. Slavin, Aloha, Oreg.

[73] Assignee: Tektronix, Inc., Beaverton, Oreg.

[21] Appl. No.: 30,760

[22] Filed: Mar. 24, 1987

[51] Int. Cl.$^4$ ............... G01R 13/20; G01R 15/08
[52] U.S. Cl. .................... 324/121 R; 324/115; 324/130
[58] Field of Search ............ 324/132, 115, 121 R, 324/102, 130, 74; 364/487, 571; 315/377; 358/10, 107

[56] References Cited

U.S. PATENT DOCUMENTS 3,204,144  8/1965  Deavenport ................ 324/121 R
3,873,918  3/1975  Talbert ....................... 324/115
4,271,391  6/1981  Kmetz .......................... 324/115

Primary Examiner—Ernest F. Karlsen
Attorney, Agent, or Firm—Francis I. Gray

[57] ABSTRACT

A method for locking scales to a waveform display uses reference points from the waveform to determine starting scale points. Based upon the starting scale points and the characteristics of the waveform the scales are calculated. Any changes in gain in the waveform are applied to the scales so that the scales change in direct proportion to the waveform. The field/line numbers of a television video signal are tracked and displayed on the waveform display to identify that portion of the waveform relative to a picture frame which is being displayed.

4 Claims, 6 Drawing Sheets

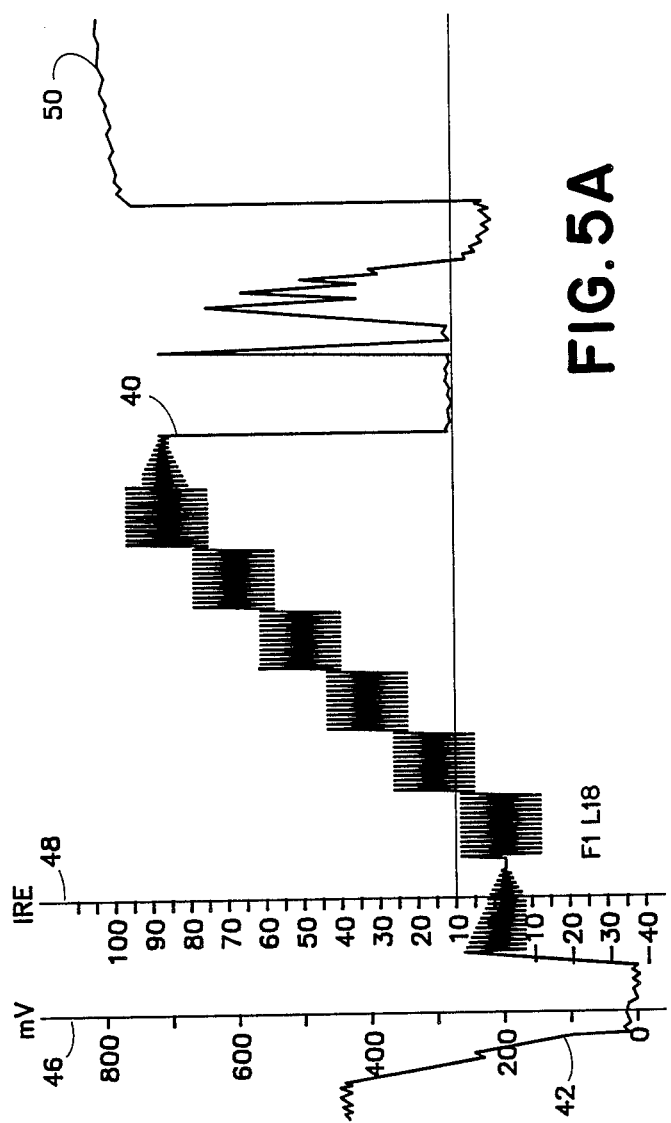

LOCKING SCALES TO WAVEFORM DISPLAYS

BACKGROUND OF THE INVENTION

The present invention relates to waveform displays, and more particularly to a method for locking scales to waveform displays so that the scale is always calibrated with respect to the waveform.

With conventional waveform display instruments such as oscilloscopes or waveform monitors the axis labels are fixed in position, whether generated as an etched graticule on a face plate over the display screen or as an electronic graticule on the display screen itself. As long as the control knobs of the instrument are in the calibrated position, parameters of the waveform can be determined from the axis labels directly. If the gain and time/distance knobs are changed to more closely examine the waveform, the axis labels are no longer calibrated and it is not possible to obtain parameter values for the waveform from them.

What is desired is a method for locking the scales represented by the axis labels to the waveform display so that gain and time/distance changes for the waveform are applied proportionally to the scales to maintain calibration between the axis labels and the waveform.

SUMMARY OF THE INVENTION

Accordingly the present invention provides a method for locking scales to a waveform display so that the axis labels remain calibrated with respect to the waveform. A horizontal reference point, such as the leading edge of a horizontal sync pulse in a television video signal, is determined as a starting reference point for a time/distance scale. Likewise a vertical reference point, such as the black or zero IRE level of a television video signal, is determined as a starting reference for an amplitude scale. For a standardized signal, such as the television video signal, certain parameters are constant, such as the distance between horizontal sync pulses and the zero and one hundred or minus forty IRE levels for an NTSC television signal. An initial scale is established starting with the reference points according to the established constant parameters. Subsequent gain and time/distance variations to the waveform display also are applied to the scales so that the scales maintain a calibrated relationship with the waveform display.

Also for television video signals due to the unique characteristics of the vertical sync pattern at the beginning of each field, the present field/line number can be determined by identifying the vertical sync pattern and incrementing or decrementing the line number according to the number of horizontal sync pulses from the determined initial line. This field/line number also is displayed next to the horizontal sync pulse so that on a waveform monitor display the appropriate horizontal line being displayed is identified.

The objects, advantages and novel features of the present invention will be apparent from the following detailed description when read in conjunction with the appended claims and attached drawing.

BRIEF DESCRIPTION OF THE DRAWING

FIGS. 5A and 5B are plan views of a partial waveform display illustrating the operation of the present invention in the vertical direction.

DESCRIPTION OF THE PREFERRED EMBODIMENT

Figure 1:
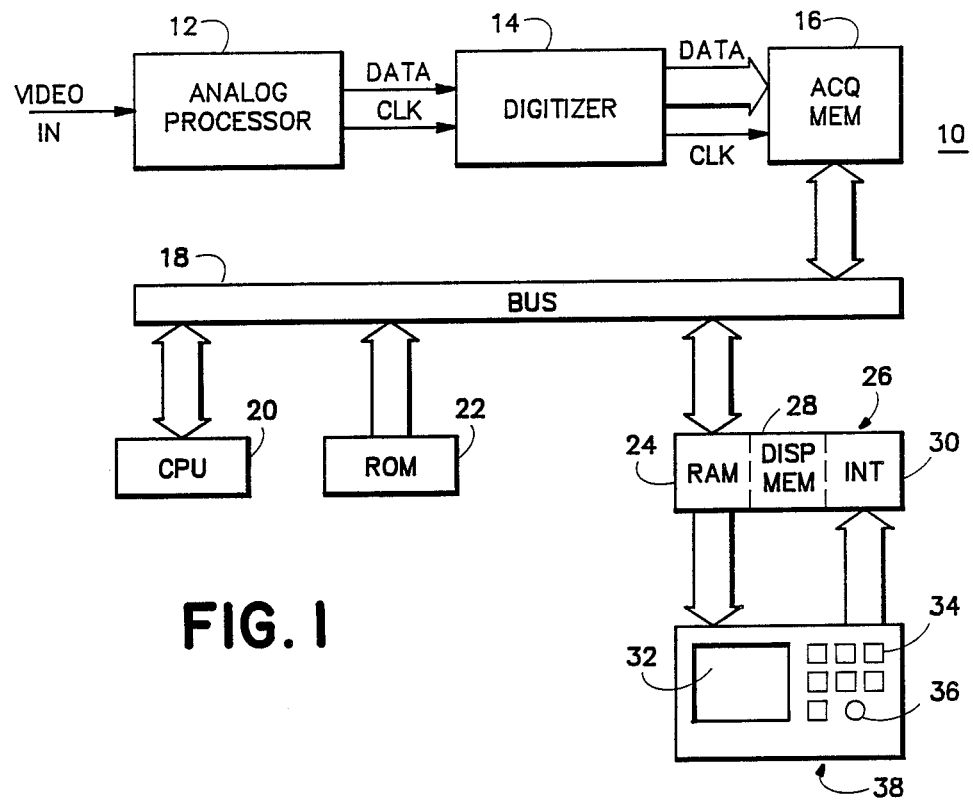
FIG. 1 is a block diagram of an instrument using the scale to waveform locking method of the present invention.
Figure 2:
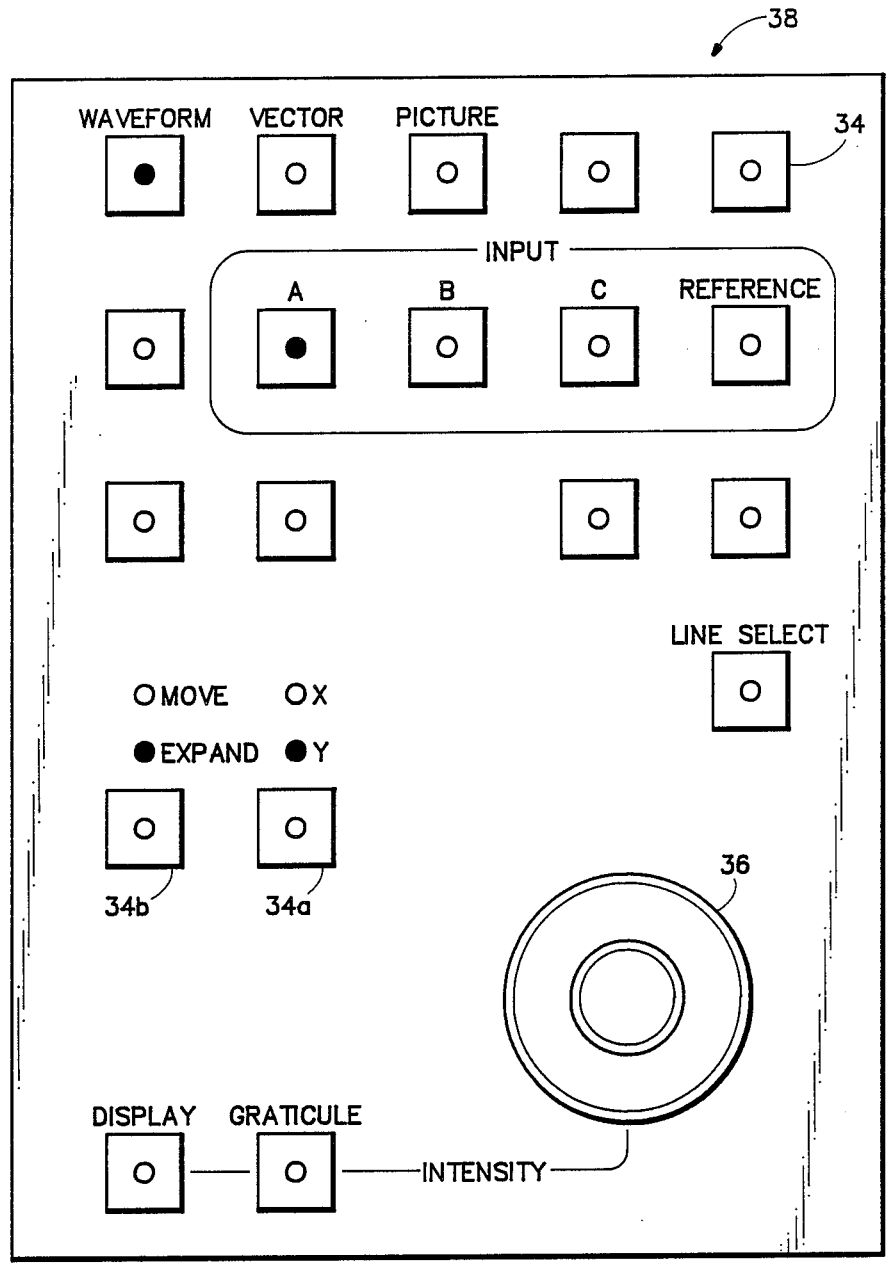
FIG. 2 is a plan view of a front panel for the instrument of FIG. 1.

Referring now to FIGS. 1 and 2 an instrument 10 is shown having a video input signal, such as a television video signal. The video signal is conventionally processed in the analog domain by an analog processor 12, digitized by a digitizer 14, and stored in an acquisition memory 16. The acquisition memory 16 is connected to a communications bus 18 to which also are connected a central processing unit (CPU) 20 with associated ROM 22 and RAM 24, and a display interface unit 26. The display interface unit 26 includes the RAM 24, a display memory 28 and an interface circuit 30. The contents of the display memory 28 are displayed on a screen 32. The digitized video data from the acquisition memory 16 is processed by the CPU 20 according to the functions and parameters input by an operator via function buttons 34 and a rotary encoder knob 36 on a front panel 38, and via interaction with the screen 32. The processed data is stored in the display memory 28 together with appropriate scales, cursors and display information. Movement of the waveform display is affected by rotation of the rotary encoder 36, with the axis of movement determined by an X/Y button 34a. Likewise expansion of the waveform display either horizontally or vertically is affected by activation of an EXPAND/MOVE button 34b in conjunction with the selection of the X/Y button 34a while rotating the rotary encoder 36.

Figure 3:
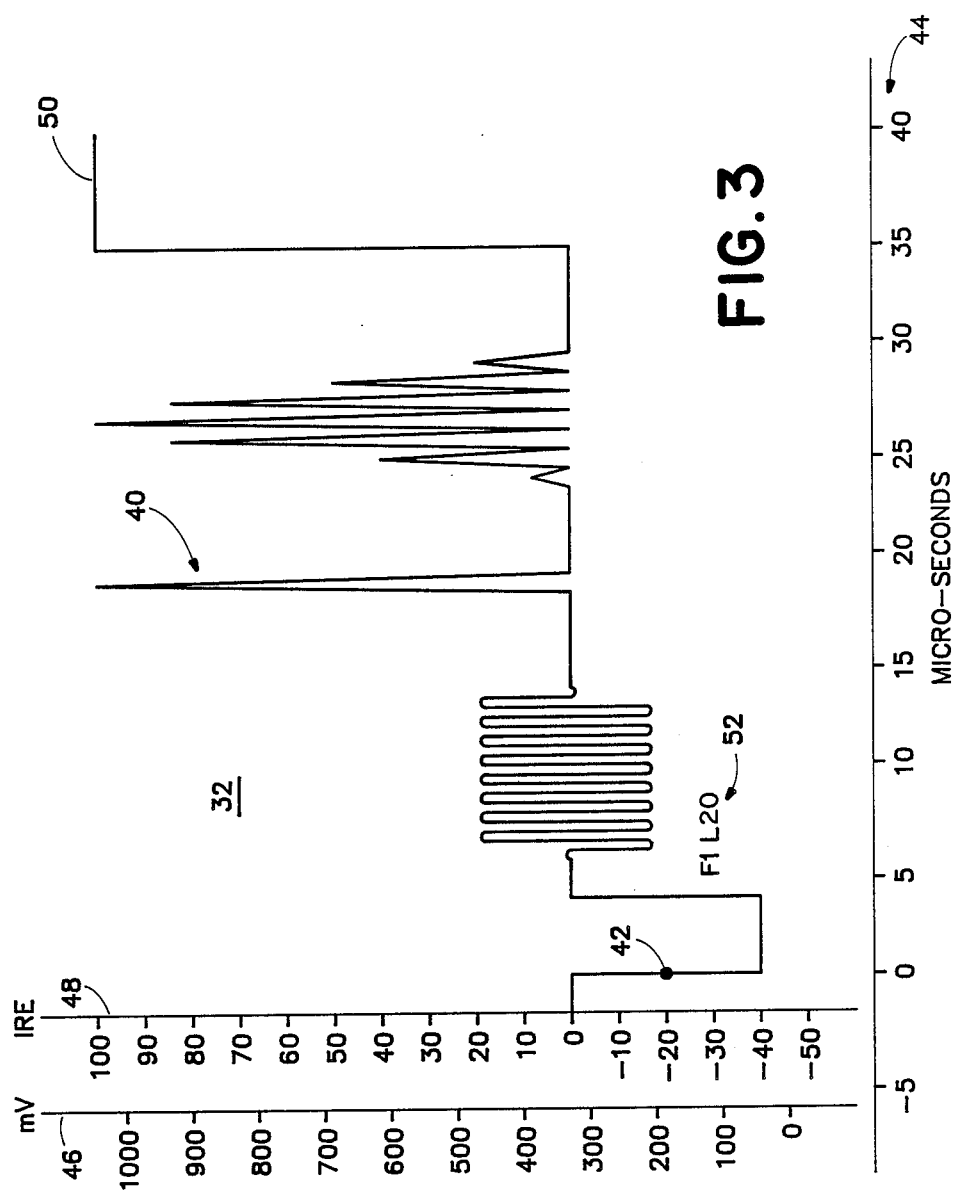
FIG. 3 is a plan view of a waveform display having scales computed according to the present invention.

FIG. 3 illustrates the initial formation by the CPU 20 of the axis scales from information provided by absolute reference points on a waveform 40 displayed. The time scale along the horizontal axis obtains a zero value from the occurrence of the first horizontal sync pulse 42 that appears on the screen 32, or from the immediately prior sync pulse when no sync pulse appears on the screen 32. Since the horizontal sync pulse 42 in a television video signal occurs at a regular interval, the period is a known nominal parameter and can be more precisely determined by averaging over several horizontal line intervals. With a given starting point and the known interval between sync pulses the scale markers 44 are generated plus and minus from the zero point and loaded into the display memory 28. In the vertical direction a volt scale 46 provides an absolute magnitude for the waveform 40 and is taken directly from the digitized data stored in the acquisition memory 16. By taking the voltage values from two different data points on the waveform 40 the voltage scale 46 is readily computed. Finally for NTSC television waveforms an IRE scale 48 is provided. The IRE scale 48 represents a proportional relationship contained within the waveform itself and changes with the input video signal. Initially a zero carrier pulse (ZCP) signal, or one hundred forty IRE bar, is searched for on a specified horizontal line within a frame. If the ZCP signal is found, then the zero and 140 IRE values are determined and the IRE scale 48 is computed by the CPU 20 accordingly. In the absence of the ZCP signal an NTC-7 or FCC VITS bar 50 is searched for, which defines one hundred IRE. In the absence of all IRE references one hundred forty IRE is set arbitrarily at one volt. Zero IRE always is set at the horizontal sync back porch. Also the amplitude of the horizontal sync pulse 42, which is nominally forty IRE, may be used to generate reference points from which the IRE scale 48 may be calculated.

Figure 4A:
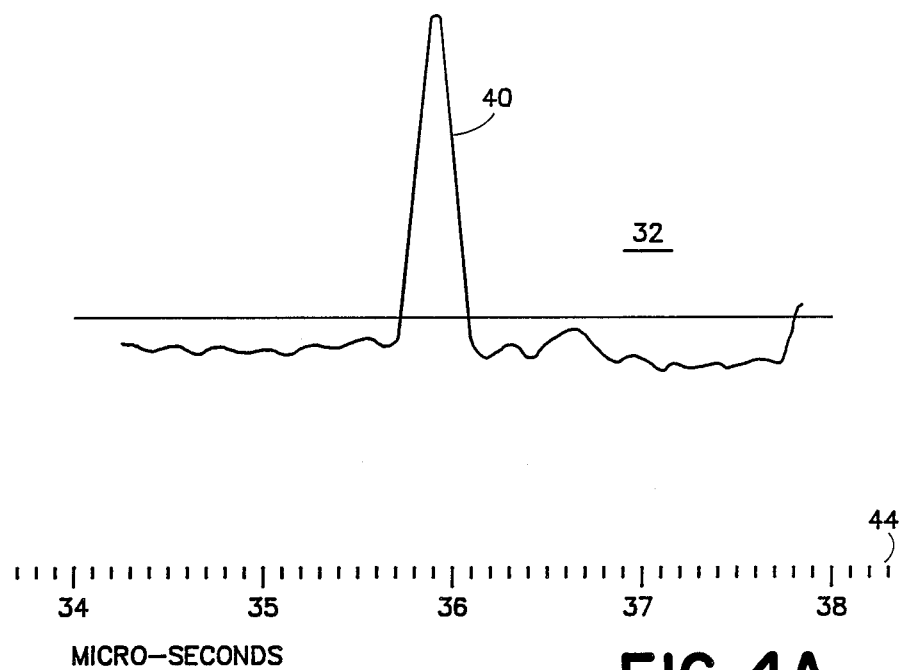
FIGS. 4A and 4B are plan views of a partial waveform display illustrating the operation of the present invention in the horizontal direction.
Figure 4B:
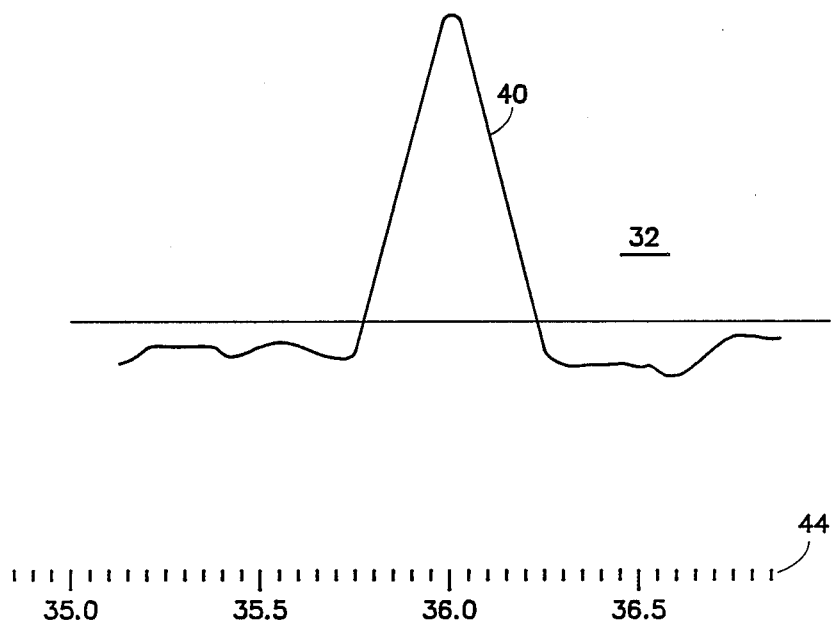
Figure 5B:
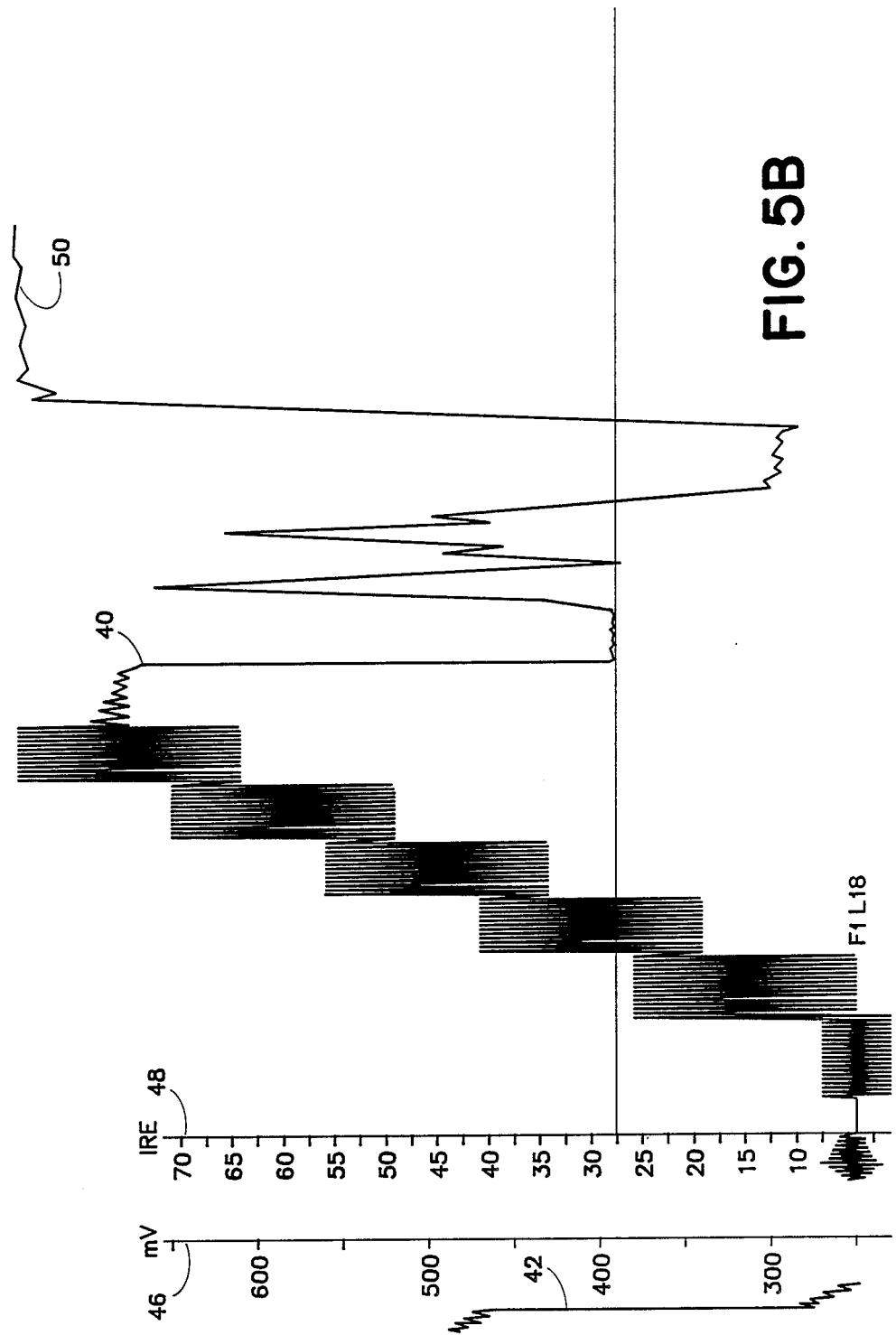

Subsequent changes in the gain and/or time/distance axes caused by expanding the waveform display result in the same gain factor being applied to the respective scales 44, 46, 48 as appropriate. Therefore, as shown in FIGS. 4A, 4B, 5A and 5B as the waveform 40 expands in either direction the respective scales 44, 46, 48 also expand. The respective scale labels change to accommodate a specified number of labels within the display screen 32 for ease of readability. The indicated scale units label along the horizontal axis, if the gain is small, is in nanoseconds, otherwise the units label is in microseconds for a typical television video application. The interval between scale labels is determined based upon the gain and a 1:2:5 transition so that for each range approximately ten scale labels are generated with appropriate intermediate tick marks. Although the horizontal dimension of the screen 32 available for waveform display does not change for this particular instrument 10, the available vertical area may vary depending upon the amount of additional information to be displayed under the waveform display. The CPU 20 takes into account the height of the available vertical area as well as the gain in computing the vertical labels and tick marks. For example as shown in FIG. 4A the labels are marked at one micro-second intervals, but when expanded as in FIG. 4B the labels are marked at 0.5 microsecond intervals. Likewise, as shown in FIGS. 5A and 5B the volt scale labels are marked at two hundred millivolt intervals and then at one hundred millivolt intervals, while the IRE scale labels change from ten IRE unit intervals to five IRE unit intervals.

Additionally the CPU 20 keeps track of the field/line numbers in a television video signal and labels each displayed waveform with the appropriate field/line number label 52. The label 52 is inserted just to the right of the left side scales 46, 48 and above the horizontal scale 44, or right after each displayed horizontal sync pulse and below the zero, or "black", level so as not to interfere with the displayed waveform.

Thus the present invention provides a method for locking scales to waveform displays by referencing absolute points on the waveform to determine the initial scale, and then applying the same gain factor to the scales as is applied to the waveform when the waveform is expanded. Also the field/line numbers for a television video signal are displayed for the waveform being displayed.

What is claimed is:

1. A method for locking scales to a displayed waveform comprising the steps of:
    determining initial starting scale points from the characteristics of the displayed waveform;
    calculating a scale display based upon the initial starting scale points; and
    applying a gain factor to the scales which is a function of the gain factor applied to the waveform so that changes in waveform gain along either axis are reflected in changes in the scales.

2. A method as recited in claim 1 wherein the determining step comprises the steps of:
    identifying horizontal sync points of the displayed waveform for a horizontal axis scale, the displayed waveform being a video signal; and
    identifying unique points of the displayed waveform having predetermined levels for a vertical axis scale.

3. A method as recited in claim 2 wherein the calculating step comprises the steps of:
    calculating a time scale for the horizontal axis scale based upon the distance between horizontal sync points, the time scale being adjusted for readability according to the horizontal portion of the displayed waveform visible on a screen; and
    calculating a voltage scale for the vertical axis scale based upon the predetermined levels, the voltage scale being adjusted for readability according to the vertical portion of the displayed waveform visible on the screen.

4. A method as recited in claim 2 wherein the calculating step comprises the steps of:
    calculating a time scale for the horizontal axis scale based upon the distance between horizontal sync points, the time scale being adjusted for readability according to the horizontal portion of the displayed waveform visible on a screen; and
    calculating an IRE scale for the vertical axis scale based upon the predetermined levels, the IRE scale being adjusted for readability according to the vertical portion of the displayed waveform visible on the screen.

* * * * *